United States Patent
Holladay et al.

(10) Patent No.: US 11,193,696 B2
(45) Date of Patent: Dec. 7, 2021

(54) ADVANCED MULTI-LAYER ACTIVE MAGNETIC REGENERATOR SYSTEMS AND PROCESSES FOR MAGNETOCALORIC LIQUEFACTION

(71) Applicants: Jamie D. Holladay, Richland, WA (US); Kerry D. Meinhardt, Kennewick, WA (US); Evgueni Polikarpov, Richland, WA (US); Edwin C. Thomsen, Richland, WA (US); John Barclay, Richland, WA (US)

(72) Inventors: Jamie D. Holladay, Richland, WA (US); Kerry D. Meinhardt, Kennewick, WA (US); Evgueni Polikarpov, Richland, WA (US); Edwin C. Thomsen, Richland, WA (US); John Barclay, Richland, WA (US)

(73) Assignees: Battelle Memorial Institute, Richland, WA (US); Emerald Energy NW, LLC, Bothell, WA (US)

( * ) Notice: Subject to any disclaimer, the term of this patent is extended or adjusted under 35 U.S.C. 154(b) by 410 days.

(21) Appl. No.: 15/937,776

(22) Filed: Mar. 27, 2018

(65) Prior Publication Data
US 2018/0283740 A1  Oct. 4, 2018

Related U.S. Application Data

(60) Provisional application No. 62/477,924, filed on Mar. 28, 2017.

(51) Int. Cl.
*F25B 21/00* (2006.01)
*H01L 37/04* (2006.01)
(Continued)

(52) U.S. Cl.
CPC .............. *F25B 21/00* (2013.01); *F25D 11/02* (2013.01); *F25J 1/001* (2013.01);
(Continued)

(58) Field of Classification Search
CPC . F25B 21/00; H01F 1/017; H01F 1/015; F25J 1/0005; F25J 1/001; F25J 2215/10;
(Continued)

(56) References Cited

U.S. PATENT DOCUMENTS 3,108,444 A  10/1963  Kahn
3,841,107 A  10/1974  Clark
(Continued)

FOREIGN PATENT DOCUMENTS

WO  WO-2017149434 A1 * 9/2017  ........... H01F 7/0273

OTHER PUBLICATIONS

Active Magnetic Regenerative Liquefier—Final Report (Jan. 12, 2016) (Year: 2016).*
(Continued)

*Primary Examiner* — Len Tran
*Assistant Examiner* — Jenna M Hopkins
(74) *Attorney, Agent, or Firm* — Klarquist Sparkman, LLP

(57) ABSTRACT

A process for liquefying a process gas that includes introducing a heat transfer fluid into an active magnetic regenerative refrigerator apparatus that comprises a single stage comprising dual multilayer regenerators located axially opposite to each other.

20 Claims, 5 Drawing Sheets

(51) Int. Cl.
*F25J 1/00* (2006.01)
*F28D 15/02* (2006.01)
*H01F 1/01* (2006.01)
*F25D 11/02* (2006.01)

(52) U.S. Cl.
CPC ......... *F28D 15/0275* (2013.01); *H01F 1/012* (2013.01); *H01L 37/04* (2013.01); *F25B 2321/0021* (2013.01); *F25B 2321/0022* (2013.01); *F25J 2270/908* (2013.01); *Y02B 30/00* (2013.01)

(58) Field of Classification Search
CPC . F25J 2205/90; F25J 2205/86; F25J 2270/908
USPC .......................................................... 62/3.1
See application file for complete search history.

(56) References Cited

U.S. PATENT DOCUMENTS

| | | | |
|---|---|---|---|
| 4,107,935 A | 8/1978 | Steyert, Jr. | |
| 4,332,135 A * | 6/1982 | Barclay | F25B 21/00 62/3.1 |
| 4,408,463 A * | 10/1983 | Barclay | F25B 21/00 505/889 |
| 4,441,325 A | 4/1984 | Bon-Mardion et al. | |
| 4,507,927 A | 4/1985 | Barclay | |
| 4,702,090 A * | 10/1987 | Barclay | F25B 21/00 62/3.3 |
| 4,704,871 A * | 11/1987 | Barclay | F25B 21/00 62/3.1 |
| 4,829,770 A * | 5/1989 | Hashimoto | C09K 5/16 62/3.1 |
| 5,124,215 A * | 6/1992 | Hashimoto | C09K 5/16 428/548 |
| 5,182,914 A | 2/1993 | Barclay et al. | |
| 5,209,068 A | 5/1993 | Saji et al. | |
| 5,213,630 A * | 5/1993 | Hashimoto | C09K 5/16 148/301 |
| 5,249,424 A * | 10/1993 | DeGregoria | F25B 21/00 62/3.1 |
| 5,435,137 A * | 7/1995 | Gschneidner, Jr. | H01F 1/015 148/301 |
| 5,444,983 A * | 8/1995 | Howard | F25B 21/00 62/3.1 |
| 5,462,610 A * | 10/1995 | Gschneidner, Jr. | C22C 28/00 148/301 |
| 5,641,424 A | 6/1997 | Ziolo et al. | |
| 5,743,095 A * | 4/1998 | Gschneidner, Jr. | F25B 21/00 148/301 |
| 5,887,449 A * | 3/1999 | Pecharsky | F25B 21/00 62/3.1 |
| 6,245,250 B1 | 6/2001 | Krawzak et al. | |
| 6,332,323 B1 * | 12/2001 | Reid | F25B 29/003 62/6 |
| 6,467,274 B2 * | 10/2002 | Barclay | F25J 1/001 62/3.1 |
| 6,526,759 B2 * | 3/2003 | Zimm | F25B 21/00 62/3.1 |
| 6,589,366 B1 * | 7/2003 | Gschneidner, Jr. | C22C 28/00 148/101 |
| 6,676,772 B2 * | 1/2004 | Saito | H01F 1/015 148/301 |
| 6,758,046 B1 | 7/2004 | Barclay et al. | |
| 7,076,959 B2 * | 7/2006 | Lewis | H01F 1/017 252/62.55 |
| 8,037,692 B2 * | 10/2011 | Muller | F25B 21/00 62/3.1 |
| 8,061,147 B2 | 11/2011 | Dinesen et al. | |
| 8,099,964 B2 | 1/2012 | Saito et al. | |
| 8,551,210 B2 | 10/2013 | Reppel et al. | |
| 8,683,815 B2 * | 4/2014 | Muller | F25B 21/00 62/3.1 |
| 8,852,328 B2 * | 10/2014 | Barclay | B01D 53/06 96/125 |
| 8,935,927 B2 * | 1/2015 | Kobayashi | F25B 21/00 62/3.1 |
| 9,175,885 B2 | 11/2015 | Katter | |
| 9,245,673 B2 * | 1/2016 | Carroll | H01F 1/015 |
| 9,310,108 B2 | 4/2016 | Kaji et al. | |
| 9,528,728 B2 * | 12/2016 | Smith | F25B 21/00 |
| 9,677,792 B2 | 6/2017 | Auringer et al. | |
| 9,739,510 B2 * | 8/2017 | Hassen | F25B 21/00 |
| 9,746,214 B2 | 8/2017 | Zimm | |
| 9,777,952 B2 * | 10/2017 | Eriksen | F25B 21/00 |
| 9,791,182 B2 | 10/2017 | Muller | |
| 9,797,630 B2 | 10/2017 | Benedict et al. | |
| 9,995,511 B2 | 6/2018 | Leonard et al. | |
| 10,138,139 B2 | 11/2018 | Kokktnos et al. | |
| 10,229,775 B2 * | 3/2019 | Scharf | F25B 21/00 |
| 10,281,176 B2 * | 5/2019 | Mun, II | F25B 21/00 |
| 10,443,928 B2 * | 10/2019 | Holladay | F25B 21/00 |
| 10,520,229 B2 | 12/2019 | Schroeder et al. | |
| 10,527,325 B2 | 1/2020 | Schroeder et al. | |
| 10,551,095 B2 | 2/2020 | Schroeder | |
| 10,557,649 B2 * | 2/2020 | Schroeder | F25B 21/00 |
| 10,612,668 B1 * | 4/2020 | Barclay | F25B 21/00 |
| 10,641,539 B2 * | 5/2020 | Schroeder | H01F 1/012 |
| 10,648,704 B2 * | 5/2020 | Schroeder | F28D 9/0012 |
| 10,648,705 B2 * | 5/2020 | Schroeder | F25D 11/02 |
| 10,648,706 B2 * | 5/2020 | Schroeder | F25B 21/00 |
| 10,684,044 B2 * | 6/2020 | Schroeder | H01F 1/012 |
| 2002/0040583 A1* | 4/2002 | Barclay | F25J 1/001 62/3.1 |
| 2006/0080979 A1 | 4/2006 | Kitanovski et al. | |
| 2007/0144181 A1* | 6/2007 | Kitanovski | F25B 21/00 62/3.1 |
| 2008/0016907 A1* | 1/2008 | Barclay | F25J 1/0022 62/612 |
| 2008/0314049 A1* | 12/2008 | Shin | F25B 21/00 62/3.1 |
| 2010/0175392 A1* | 7/2010 | Malloy | H01L 37/02 62/3.2 |
| 2010/0212327 A1* | 8/2010 | Barve | F25B 21/00 62/3.1 |
| 2011/0048032 A1 | 3/2011 | Chang et al. | |
| 2011/0062821 A1 | 3/2011 | Chang et al. | |
| 2011/0308258 A1 | 12/2011 | Smith et al. | |
| 2013/0019610 A1* | 1/2013 | Zimm | F25B 21/00 62/3.1 |
| 2013/0042632 A1 | 2/2013 | Muller et al. | |
| 2015/0068219 A1* | 3/2015 | Komorowski | F25B 21/00 62/3.1 |
| 2015/0068246 A1 | 3/2015 | Hakamade et al. | |
| 2015/0168030 A1 | 6/2015 | Leonard et al. | |
| 2017/0241706 A1* | 8/2017 | Holladay | F25J 1/001 |
| 2017/0244120 A1* | 8/2017 | Holladay | F25J 1/001 |
| 2017/0372821 A1* | 12/2017 | Scharf | C09D 133/12 |
| 2018/0283740 A1* | 10/2018 | Holladay | H01F 1/012 |
| 2018/0283772 A1* | 10/2018 | Holladay | H01F 1/015 |
| 2019/0137171 A1* | 5/2019 | Barclay | F25B 21/00 |
| 2019/0352747 A1* | 11/2019 | Ihnfeldt | F25B 21/00 |
| 2019/0390899 A1* | 12/2019 | Holladay | F25J 1/0225 |

OTHER PUBLICATIONS

Adapting an active magnetic regenerator to acontinuous fluid flow application (Oct. 16, 2017) (Year: 2017).*
Investigation of bypass fluid flow in an active magnetic regenerative liquefier (May 19, 2018) (Year: 2018).*
Magnetic refrigerator for hydrogen liquefaction (Apr. 16, 2014) (Year: 2014).*
Non-Final Office Action issued by U.S. Patent and Trademark Office dated Jan. 30, 2019 for U.S. Appl. No. 15/438,529.
Barclay et al., "Active Magnetic Regenerative Liquefier: SBIR Phase I Final Report," 47 pages, U.S. Department of Energy Contract No. DOE SBIR DE-FG02-07ER84783, 2008.
Barclay et al., "Unique features of liquefaction of hydrogen and natural gas using magnetic refrigeration," *Proceedings of the 6th*

(56) References Cited

OTHER PUBLICATIONS

*International Conference on Magnetic Refrigeration*, pp. 1-6, Sep. 7-10, 2014.
Barclay, "The theory of an active magnetic regenerative refrigerator," NASA Conference Publication, 13 pages, 1983.
Carpetis, "An assessment of the efficiency and refrigeration power of magnetic refrigerators with ferromagnetic refrigerants," *Advances in Cryogenic Engineering*, vol. 39.,1994.
DeGregoria et al., "Modeling the Active Magnetic Regenerator" *Advances in Cryogenic Engineering*, vol. 37, pp. 867-873, 1992.
Janda et al., "Design of an active magnetic regenerative hydrogen liquefier," *Advances in Cryogenic Engineering*, vol. 37, 1992.
Rowe et al., "Ideal magnetocaloric effect for active magnetic regenerators," *J. Appl. Phys.*, 93(3): 1672-1676, Feb. 1, 2003.
Thomas, "Fuel cell and battery electric vehicles compared," *International Journal of Hydrogen Energy*, vol. 34, pp. 6005-6020, 2009.
Astronautics Corporation of America; Jul. 2, 1992; Final Report on the "Magnetic Liquefier for Hydrogen Project"; DOE Contract No. DE-AC02-90CE40895.
U.S. Appl. No. 15/438,529, filed Feb. 21, 2017.
U.S. Appl. No. 15/438,536, filed Feb. 21, 2017.
U.S. Appl. No. 15/937,773, filed Mar. 27, 2018.
Zhang et al., "Design optimization of a 0.1-ton/day active magnetic regenerative hydrogen liquefier," *Cryogenics*, 40(4-5): 269-278, Apr.-May 2000.
Barclay et al., "Active Magnetic Regenerative Liquefier: Final Report," Heracles Energy Corporation d.b.A Prometheus Energy, Jan. 12, 2016.
Holladay et al., "III.10 Magnetocaloric Hydrogen Liquefaction FY 2016 Annual Progress Report," Pacific Northwest National Laboratory, 2016.
Holladay et al., "III.14 Magnetocaloric Hydrogen Liquefaction FY 2015 Annual Progress Report," Pacific Northwest National Laboratory, 2015.
International Search Report and Written Opinion issued for International Application No. PCT/US2018/024668 dated Jun. 20, 2018.
Chen et al., "Development of a brassboard active magnetic regenerative refrigeration system for low temperature remote cooling," *Cryocoolers*, vol. 20, International Cryocooler Conference, Jun. 2018.
Final Office Action issued for U.S. Appl. No. 16/563,692 dated Jul. 28, 2020.
Holladay, et al., "MagnetoCaloric Hydrogen Liquefaction", Project ID#: PD131 Pacific Northwest National Laboratory, Jun. 2018.
Non-Final Office Action issued by U.S. Patent and Trademark Office dated Nov. 25, 2019 for U.S. Appl. No. 16/563,692.
Non-Final Office Action issued by U.S. Patent and Trademark Office dated Jun. 15, 2020 for U.S. Appl. No. 15/438,536.
Non-Final Office Action issued by U.S. Patent and Trademark Office dated Aug. 20, 2020 for U.S. Appl. No. 15/937,773.
Petitpas et al., "Liquid Hydrogen Infrastructure Analysis", Project ID#: PD135 DOE Hydrogen and Fuel Cells Annual Merit Review, Washington, D.C., Jun. 6, 2017.
U.S. Appl. No. 16/563,692, filed Sep. 6, 2019.
Weitzel et al., "Ortho-Para Catalysis in Liquid-Hydrogen Production," *Journal of Research of the National Bureau of Standards*, 60(3): 221-228, Mar. 1958.
Final Office Action issued for U.S. Appl. No. 15/937,773 dated May 7, 2021.

* cited by examiner

ADVANCED MULTI-LAYER ACTIVE MAGNETIC REGENERATOR SYSTEMS AND PROCESSES FOR MAGNETOCALORIC LIQUEFACTION

CROSS REFERENCE TO RELATED APPLICATIONS

This application claims the benefit of U.S. Provisional Application No. 62/477,924, filed Mar. 28, 2017, which is herein incorporated by reference in its entirety.

ACKNOWLEDGMENT OF GOVERNMENT SUPPORT

This invention was made with government support under Contract No. DE-AC05-76RL01830 awarded by the U.S. Department of Energy. The government has certain rights in the invention.

BACKGROUND

Broad use of hydrogen as a fuel or energy carrier will provide better energy security, return major economic, environmental, and health benefits, and help minimize climate-change impact of greenhouse-gas emissions from energy use. Hydrogen couples into any realistic model of "sustainable carbon-hydrogen-electricity cycles" in an integrated and critical manner.

For storage and delivery, liquid hydrogen ($LH_2$) is the superior choice rather than compressed ($CH_2$), adsorbed, or chemical compounds of hydrogen because of $LH_2$'s higher volumetric energy density and gravimetric energy density compared to other hydrogen storage methods. The ratio of the ideal minimum work input per unit mass of gas to the real work input per unit mass of gas for a practical liquefier is called figure of merit (FOM). Currently most gaseous hydrogen ($GH_2$) is liquefied using liquid nitrogen pre-cooled Claude-cycle plants. These conventional large-scale liquefiers are limited to a FOM of ~0.35. Small-scale conventional liquefiers seldom achieve FOMs of 0.25. Such a low FOM increases operating costs of hydrogen liquefiers and thereby the price of dispensed $LH_2$ or $CH_2$ fuel.

A relatively small number of hydrogen liquefiers presently exist in the world. Most of them are large industrial plants with capacities ranging from ~5 metric tons/day to ~100 metric tons/day. Most commercial $H_2$ has been used for non-transportation applications such as at refineries and ammonia fertilizer plants. Few commercial liquefaction facilities have been built with capacities below ~5 metric tons/day because the turn-key installed costs tend to increase sharply on a per metric ton/day basis as the capacity decreases. The depreciation of high capital costs of hydrogen liquefiers increases the price of dispensed $LH_2$ or $CH_2$ fuel. For example, a 1 metric ton/day $LH_2$ facility has an approximate installed cost of ~$9-11 million, i.e., ~$10 million/metric ton/day. Over a 20-year operating period of a plant of this capacity and cost, straight-line depreciation gives a contribution of ~$1.45/kg to $H_2$ fuel cost.

The major barriers to deployment of fuel-cell electric vehicles are lack of local supply and refueling infrastructure with capacity in the range of 0.1 to 1 metric ton/day at each refueling station with delivery of $LH_2$ or $CH_2$ at the same price or less than gasoline on a fuel cost/mile driven basis. Cost-effective and efficient hydrogen liquefiers on this scale for such refueling supply and refueling stations do not exist. These two key barriers to more rapid adoption of hydrogen fuels can be eliminated by development of highly-efficient and low-cost small-scale liquefiers.

Active magnetic regenerative refrigerator (AMRR) systems with high performance magnetic regenerators with multiple magnetic refrigerants may be able to efficiently liquefy hydrogen, but there have been several problems in developing multi-layer regenerators which are theoretically capable of efficiently spanning large temperature ranges required for cryogen liquefier systems such µ280 K to ~20 K for $LH_2$. However, in practice, operational multi-layer cryogenic regenerators spanning over more than ~80 K do not exist.

SUMMARY

Disclosed herein in one embodiment is a process for liquefying a process gas comprising:

introducing a heat transfer fluid into an active magnetic regenerative refrigerator apparatus that comprises dual regenerators located axially opposite to each other, wherein the apparatus comprise (i) a first top regenerator comprising 2 to 16 successive layers, wherein each layer comprises an independently compositionally distinct magnetic refrigerant material having an independent Curie temperature and wherein the first layer of the top regenerator has the highest Curie temperature and the last layer of the top generator has the lowest Curie temperature and (ii) a second bottom regenerator comprising 2 to 16 successive layers, wherein each layer comprises an independently compositionally distinct magnetic refrigerant material having an independent Curie temperature and wherein the first layer of the bottom regenerator has the lowest Curie temperature and the last layer of the bottom regenerator has the highest Curie temperature;

flowing the heat transfer fluid through each layer of the first top regenerator and each layer of the second bottom regenerator;

diverting a portion of the flowing heat transfer fluid from an outlet of each layer of the first top regenerator to an inlet of the corresponding Curie temperature layer of the second bottom regenerator, except for lowest Curie temperature layer;

diverting a bypass portion of the flowing heat transfer fluid from the lowest Curie temperature layer of the first top regenerator into a bypass flow heat exchanger at a first cold inlet temperature;

introducing the process gas into the bypass flow heat exchanger at a first hot inlet temperature and at a counter-flow with the bypass portion flow, and discharging the process gas or liquid from the bypass flow heat exchanger at a first cold exit temperature; and simultaneously subjecting all of the layers of the second bottom regenerator to a higher magnetic field while all of the layers of first top regenerator are demagnetized or subjected to a lower magnetic field.

Also disclosed herein is a system comprising:

a first active magnetic regenerative regenerator comprising 2 to 16 successive layers, wherein each layer comprises an independently compositionally distinct magnetic refrigerant material having an independent Curie temperature and wherein the first layer of the first active magnetic regenerative regenerator has the highest Curie temperature and the last layer of the first active magnetic regenerative regenerator has the lowest Curie temperature;

a second active magnetic regenerative regenerator comprising 2 to 16 successive layers, wherein each layer comprises an independently compositionally distinct magnetic refrigerant material having an independent Curie temperature and wherein the first layer of the second active magnetic regenerative regenerator has the lowest Curie temperature and the last layer of the second active magnetic regenerative regenerator has the highest Curie temperature;

at least one conduit fluidly coupled between the lowest Curie temperature layer of the first active magnetic regenerative regenerator and the highest Curie temperature layer of the second active magnetic regenerative regenerator;

a single bypass flow heat exchanger (a) fluidly coupled to the lowest Curie temperature layer of the first active magnetic regenerative regenerator and (b) fluidly coupled to a process gas source; and for each layer of the first active magnetic regenerative regenerator and each layer of the second active magnetic regenerative regenerator, an independent fluid conduit between an outlet of each layer of the first active magnetic regenerative regenerator to an inlet of the corresponding Curie temperature layer of the second active magnetic regenerative regenerator, except for lowest Curie temperature layer of first module.

Further disclosed herein is an apparatus comprising:

an active magnetic regenerative regenerator comprising multiple successive layers, wherein each layer comprises an independently compositionally distinct magnetic refrigerant material having Curie temperatures 18-22 K apart between successively adjacent layers, and the layers are arranged in successive Curie temperature order and magnetic refrigerant material mass order with a first layer having the highest Curie temperature layer and highest magnetic refrigerant material mass and the last layer having the lowest Curie temperature layer and lowest magnetic refrigerant material mass.

The foregoing will become more apparent from the following detailed description, which proceeds with reference to the accompanying figures.

DETAILED DESCRIPTION

Figure 1:
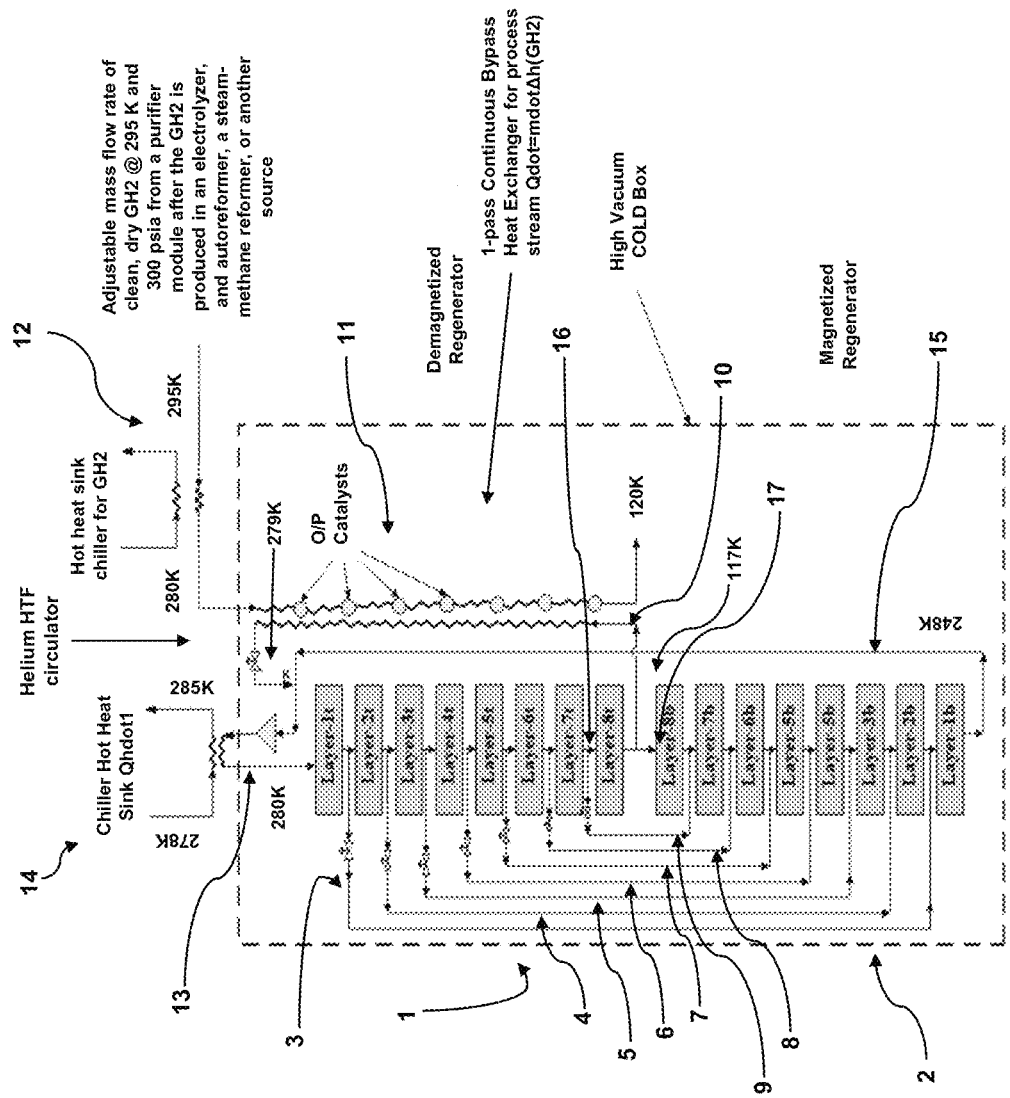
FIG. 1 is a schematic of an eight layer dual active magnetic regenerator (AMR) for active magnetic regenerative refrigeration (AMRR) with continuous bypass flow operating between 280 K and 120 K.

Disclosed herein are processes and systems that include active magnetic regenerative refrigerators (AMRRs) for liquefying any process stream that liquefies below ~200 K including ethane, methane, argon, nitrogen, neon, hydrogen, or helium process gases. In certain embodiments, the process gas comprises hydrogen. In certain embodiments, the process gas consists essentially of hydrogen (e.g., 95%, 96%, 97%, 98% or 99% hydrogen, with the remainder non-condensing or freezing impurities such as helium gas). In certain embodiments, the process gas consists of hydrogen.

The AMRR processes and systems can have several configurations such as reciprocating dual active magnetic regenerators or continuously rotating wheel active magnetic regenerators with multiple layers of magnetic refrigerants that execute active magnetic regenerative cycles when coupled to a reversing flow of heat transfer gas or liquid in the magnetized or demagnetized step of the cycle.

In particular, disclosed herein are configurations and processes in which an AMRR regenerator includes 2 to 16, more particularly eight, layers of compositionally-distinct magnetic refrigerant materials. In certain embodiments, an AMRR apparatus is a dual regenerator apparatus that includes a first AMRR regenerator and a second AMRR regenerator, wherein the first AMRR regenerator includes 2 to 16, more particularly eight, layers of compositionally-distinct magnetic refrigerant materials and the second AMRR regenerator includes 2 to 16, more particularly eight, layers of compositionally-distinct magnetic refrigerant materials. In certain embodiments, the first AMRR regenerator and the second AMRR regenerator are structurally identical to each other. When in a top position (see, e.g. FIG. 1 for an example of "top"), the multiple layers of the AMRR regenerator are arranged sequentially from highest Curie temperature to lowest Curie temperature. The apparatus is configured so that the highest Curie temperature layer is contacted first by the heat transfer fluid in the demagnetized field, and lowest Curie temperature layer is contacted first by the heat transfer fluid in the magnetized field. In other words, the layers are arranged in sequential order from the highest Curie temperature layer to the lowest Curie temperature layer along the flow direction of the hot heat transfer fluid to cold heat transfer fluid, but are in sequential order from the lowest Curie temperature layer to the highest Curie temperature layer along the flow direction when the flow is reversed from cold heat transfer fluid to hot heat transfer fluid.

Also disclosed herein are systems and processes that include multiple independent AMRR stages, each AMRR stage including at least one AMRR regenerator having multiple layers of compositionally-distinct magnetic refrigerant materials. For example, in the case of hydrogen process gas a first stage with dual opposing identical regenerators, each with eight magnetic refrigerant layers, cools the hydrogen process gas from 280 K to 120 K, and a second stage with dual opposing identical regenerators, each with five magnetic refrigerant layers, cools the hydrogen process gas from 120 K to 20 K.

During a single AMR cycle all of the magnetic refrigerant material layers of the AMRR dual regenerators are simultaneously subjected to an equal high magnetic field in one step and all of the magnetic refrigerant material layers are simultaneously de-magnetized to a low magnetic field in another step. In other words, each individual layer during the magnetization step is subject to the same magnetic field strength at the same time, and each individual layer during the demagnetization step is de-magnetized at the same time. These steps occur at different times in the reciprocating AMRR embodiment and simultaneously in different regions (i.e., sections) of the wheel in a rotary AMRR embodiment. In the reciprocating embodiment this is periodically accomplished by axially moving the regenerators with the magnet stationary; in the rotary wheel embodiment this is continuously accomplished by rotating the wheel through a high field region on about ⅓ of the rim of the wheel and through a low field region oppositely located on about ⅓ of the rim of the wheel.

The layered active magnetic regenerators enable larger differences between the average temperatures $T_{HOT}$ and $T_{COLD}$ necessary to use fewer stages in the new hydrogen liquefier design. The magnetic regenerators are fabricated with multiple longitudinally or radially-layered magnetic refrigerants located such that the Curie temperature of each refrigerant is above the average AMR-cycle hot temperature $T_{HOT}$ by $\Delta T_{HOT}$ at that axial location in the regenerators in steady-state operation to maximize refrigerant thermal mass differences and thereby percentage of bypass heat transfer gas flow. All the refrigerants in the AMRR individually execute small magnetic Brayton cycles as they are alternately magnetized and demagnetized by the magnetic field and connected together from $T_{HOT}$ to $T_{COLD}$ by the flowing helium heat transfer gas. This coupling allows the overall temperature span of an AMRR to be many times adiabatic temperature changes from the magnetocaloric effect of each magnetic refrigerant. The thermomagnetic properties of properly layered refrigerants must simultaneously have entropy flows that satisfy the 2nd law of thermodynamics with allowance for generation of irreversible entropy and effects of bypass flows.

In certain embodiments, the multiple layers of different ferromagnetic refrigerants have Curie temperatures about 20 K (e.g., 18-22 K) apart between successively adjacent layers with the coldest layer adjacent to the bypass flow outlet. In certain embodiments for hydrogen process gas at modest supply pressure such as ~300 psia, the Curie temperature of the outermost layer to the Curie temperature of the innermost layer (i.e., the innermost layer is adjacent to the bypass flow outlet) spans from ~293 K to ~153 K. In certain embodiments for hydrogen process gas, the Curie temperature of the outermost layer to the Curie temperature of the innermost layer (i.e., the innermost layer is adjacent to the bypass flow outlet) spans from ~293 K to ~50 K. In certain embodiments for methane process gas at ~200 psia, the Curie temperature of the outermost layer to the Curie temperature of the innermost layer (i.e., the innermost layer is adjacent to the bypass flow outlet) spans from ~293 K to ~150 K. In certain embodiments for helium process gas at ~15 psia, the Curie temperature of the outermost layer to the Curie temperature of the innermost layer (i.e., the innermost layer is adjacent to the bypass flow outlet) spans from ~293 K to ~18 K.

A further feature of the systems and processes disclosed herein is the diversion of a portion of the heat transfer fluid flow from each Curie temperature layer, except for the lowest Curie temperature layer or the layer fluidly coupled to the bypass flow outlet, of the AMMR dual regenerators or AMRR apparatus in the demagnetized step (or regenerator) to the corresponding Curie temperature layer in the magnetized step (or regenerator). This controlled diverted flow allows each layer to have the optimum mass of refrigerant, and the corresponding optimum flow of heat transfer fluid (including bypass flows). In certain embodiments described herein, the systems and processes can provide refrigeration between 280 K and 120 K with an apparatus utilizing rotary wheels, rotary belts, or reciprocating regenerators with stationary magnets, each apparatus carrying regenerators comprised of layered ferromagnetic materials with Curie temperatures between 293 K and 153 K. The processes and systems further utilize bypass flow of a portion of cooled heat transfer fluid (e.g., a gas) to pre-cool a separate process stream to be liquefied.

To make a highly efficient liquefier for hydrogen or other process gases, several features should be used in its design. These features include:

Use an inherently efficient thermodynamic cycle;
Use an efficient work input device or mechanism;
Use an efficient work recovery device or mechanism;
Insure small temperature approaches for heat transfer between or among streams or between solids and streams;
Use high specific area and highly-effective regenerative and/or recuperative heat exchangers;
Keep pressure drops for heat transfer gas flows and process gas flow very low;
Invoke low longitudinal thermal conduction mechanisms via material and geometry choices;
Minimize frictional and parasitic heat leak mechanisms; and
Specifically for hydrogen, perform ortho-to-para conversion at the highest possible temperature during cooling in the process heat exchangers.

In active magnetic regenerative liquefier (AMRL) designs rejection and absorption of heat are achieved by the temperature increase or decrease of magnetic refrigerants in regenerators upon isentropic magnetization or demagnetization combined with reciprocating flow of heat transfer gas. The cycle steps that magnetic refrigerants in an active magnetic regenerator (AMR) execute are: i) magnetization with no heat transfer gas flow; ii) cold-to-hot heat transfer gas flow at constant magnetic high field; iii) demagnetization with no heat transfer gas flow; and iv) hot-to-cold heat transfer flow at constant low or zero field. The AMR cycle of one or more refrigerants thermally connected by heat transfer fluid flow (e.g., a gas) in AMRR stages can be used to design excellent liquefiers whose potential for high performance comes from:

Almost reversible nature of magnetization-demagnetization steps in an AMR cycle at up to hertz frequencies for certain magnetic refrigerants. In contrast, it is inherently difficult to reversibly achieve high compression ratios, high throughput, and high efficiency in gas compression because of fundamentally poor thermal conductivity of low-density gases such as hydrogen or helium;
Efficient internal heat transfer between porous working refrigerant solids and flowing heat transfer fluids (e.g., a gas) in AMR cycles can maintain small temperature differences at all times during the cycle by using geometries with high specific areas such as ~10,000 $m^2/m^3$ in high-performance regenerators;
Efficient cooling of the hydrogen or other process gas and the AMRR heat transfer gas. This is a critical element of efficient liquefier design. To illustrate this point, the real work required to operate a single AMRR (or any other type of single-stage refrigerator between 280 K and 20 K) as a hydrogen liquefier with the hydrogen process stream entering the AMRR at 280 K into a single process heat exchanger at will be at least 4 times larger than the ideal minimum work of hydrogen liquefaction due to the large initial approach temperature in the single process heat exchanger. The huge impact on FOM of this single design feature illustrates the importance of reduction of approach temperatures in process heat exchangers in liquefiers of hydrogen. Conventional gas cycle liquefiers with only two to four heat exchanger stages inherently limit their FOM to about 0.50 before other real component inefficiencies are incorporated. Reducing the approach temperatures in process heat exchangers by using counterflowing bypass flow of a small percentage of heat transfer gas is a unique feature of AMRL designs to achieve a FOM greater than 0.5. Further the novel processes and systems disclosed herein substantially reduce the number of AMRR stages required for higher FOM over large temperature ranges as explained more fully below;

High energy density from use of solid refrigerants in compact regenerative beds can become high power densities with AMR cycles at hertz frequencies; and Safe, reliable, durable, compact, and cost-effective devices.

The above-explained desired features can be achieved by incorporating into the systems and processes at least one, and preferably a combination, of the following inventive aspects disclosed herein:

Continuous bypass flow to continuously pre-cool the process gas stream. The bypass gas flow is determined by the amount necessary to completely pre-cool the process gas stream while maintaining small 1-2 K temperature approaches between counterflowing bypass gas and process gas;

The heat capacity of the magnetic refrigerant changes with the magnetic field, especially in the temperature region from the Curie temperature to ~25-30 K lower. Therefore, the thermal mass, or heat capacity multiplied by the refrigerant mass, will also vary. To take advantage of this phenomena unique to ferromagnetic refrigerants in an AMR cycle, the mass flow rate of heat transfer gas in the hot to cold flow region (low field) of the AMR cycle must be several percent (e.g., 2-12%, more particularly 2%, 3%, 4%, or 5%) larger than the mass flow rate of heat transfer gas in the cold to hot flow region (high field) of the same AMR cycle to balance (i.e., equivalent or close to the same) the energy transfers in the low and high field regions of the AMRR executing an efficient AMR cycle; the difference in heat transfer gas flows is separated from the heat transfer flow after the hot to cold flow in the AMRR to create a cold bypass stream of heat transfer gas that is warmed as it is returned to the hot temperature of the AMRR by flowing through the process stream heat exchangers in the AMRR;

The temperature difference between the bypass heat transfer entering the process heat exchanger at a first cold inlet temperature and the process gas exiting the process heat exchanger at a first cold exit temperature is 1 to 5 K, more particularly 1 to 2 K;

The magnetic refrigerant operates at or below its Curie temperature throughout an entire active magnetic regeneration cycle because this is the region where the difference of thermal mass between magnetized and demagnetized magnetic refrigerants is maximized; and/or The sensible heat of the process gas is entirely removed by the bypass flow heat exchanger.

The embodiments of the novel processes and systems described herein utilize the difference between thermal mass of each layer of ferromagnetic refrigerants below their respective Curie temperatures when magnetized and demagnetized to enable use of bypass flow over a large temperature span. The amount of bypass flow results from the additional heat transfer gas required to change demagnetized refrigerant temperatures through a regenerator in the hot-to-cold flow step of the AMR cycle over the heat transfer gas required to change magnetized refrigerant temperatures through its dual magnetized regenerator in the cold-to-hot flow step of the AMR cycle. The larger the difference in thermal mass, the larger the amount of bypass flow required in an optimized AMRR. Because the thermal difference increases with difference in magnetic field during the AMR cycle, the highest practical magnetic field changes from high field regions at 6-8 T to low field regions at 0 to 0.3 T, preferably a value such as, for example, 7 T to 0.3 T are desired. Maximum utilization of this feature is accomplished by operating each layered ferromagnetic refrigerant below its Curie temperature throughout its entire AMR cycle which requires maintaining the average $T_{HOT}$ of each layered refrigerant during its AMR cycle at least $\Delta T_{HOT}$ below its respective Curie temperature. Further, because the magnetic field-dependent thermal mass difference also decreases monotonically as the temperature of each layered magnetic refrigerant decreases below its respective Curie temperature in the regenerator, the average temperature difference between average $T_{HOT}$ and average $T_{COLD}$ of each layer of magnetic material within a regenerator of an AMRR stage is chosen to be about 20 K. In certain embodiments, the operating temperature span (average $T_{HOT}$–average $T_{COLD}$) of each refrigerant in the AMRRs is chosen to be ~20-30 K to maximize difference in thermal mass of the layered ferromagnetic refrigerants to maximize the possible bypass flow rate. Further, over the 20-30 K temperature span below the Curie temperature the adiabatic temperature change of each magnetic refrigerant for a given magnetic field change decreases with temperature to closely match the $2^{nd}$ law of thermodynamics requirements of highly efficient thermodynamic refrigeration cycles, i.e. $\Delta T_{COLD} = \Delta T_{HOT} * T_{COLD} / T_{HOT}$.

The helium bypass gas flow rate for each AMRR stage is calculated from complete enthalpy balance between that of the desired hydrogen or other process gas flow rate for a particular AMRL liquefaction rate, e.g. kg/day, and the enthalpy of the helium bypass gas flow rate in the counter-flow bypass-gas to process-gas micro-channel or other highly-effective heat exchanger. This novel feature enables the sensible and/or latent heats of the hydrogen or other process gas to be continuously and entirely removed by the warming helium bypass gas with very small approach temperatures in each process heat exchanger (PHEX) of AMRR stages of the liquefier. Use of this design feature applies no matter what hydrogen or other process stream flow rate is desired, i.e., the helium gas bypass flow rate is simply increased to completely cool the hydrogen or other process stream to within 1-2 K of the coldest temperature of the particular AMRR stage being considered. For example, the hydrogen process stream can be cooled to the bubble point temperature for a specified pressure (e.g., ~20 K for $LH_2$ at 0.1013 MPa) by appropriate flow rate of bypass gas that is initially at ~18 K before it warms to ~278 K in the continuous process heat exchanger. The average $T_{COLD}$ of the coldest AMRR stage in a hydrogen AMRL will be 1-2 K below the $LH_2$ temperature. The variable in this design procedure is the helium bypass flow; as it increases with increasing $LH_2$ liquefaction, the helium heat transfer flow through the magnetic regenerators increases which in turn increases with the refrigeration capacity of the AMRR stages.

Figure 2:
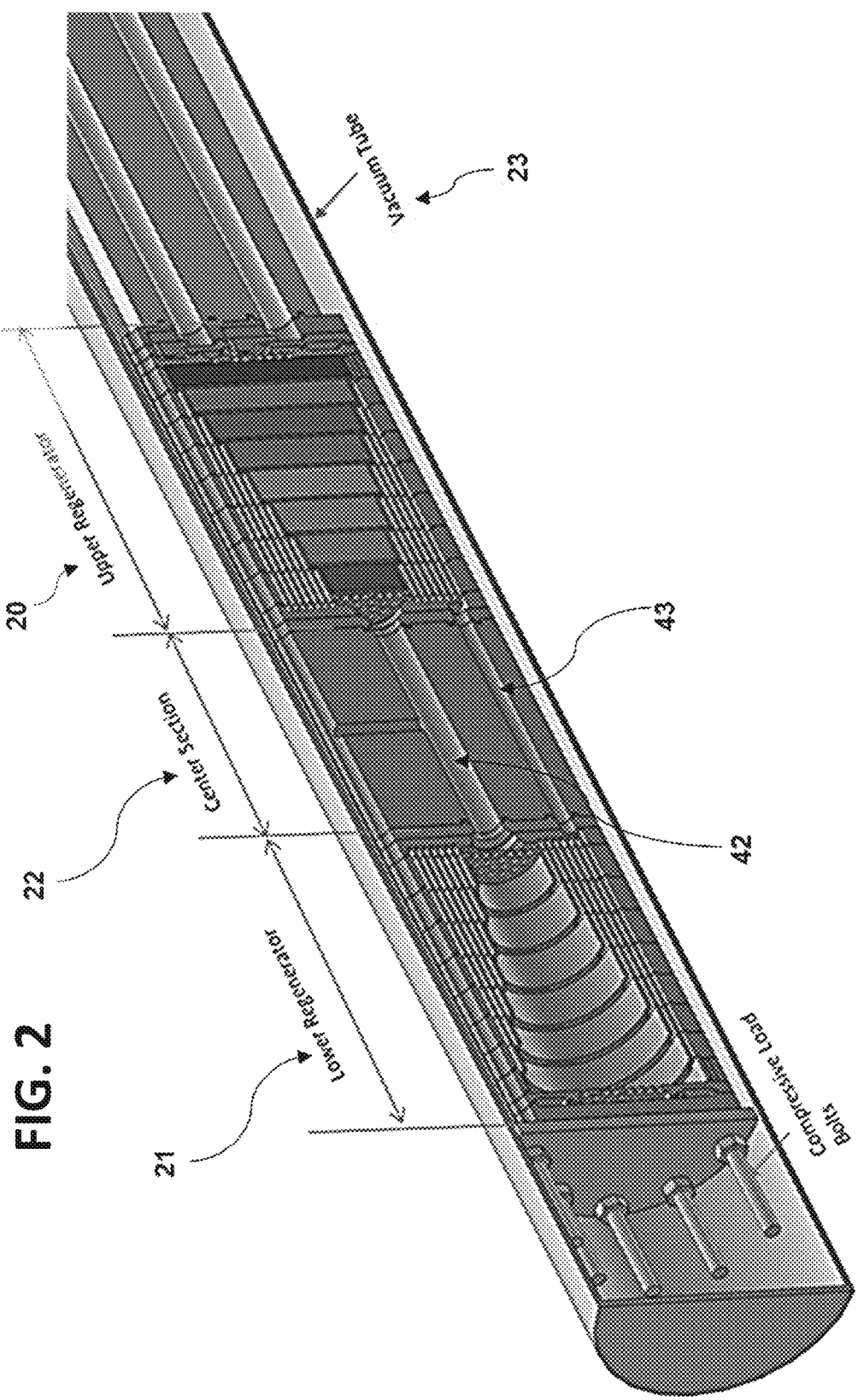
FIG. 2 is a cross sectional perspective view of an AMRR apparatus.

With this technique, the helium bypass flow rate is determined by the AMRL hydrogen or other process gas liquefaction rate. In turn, the helium bypass gas flow rate is an optimum small fraction of the helium heat transfer gas flow rate for the coldest layer of the regenerators in the AMRR stage. The total heat transfer gas flow rate for each layer is directly coupled to the detailed design variables of the AMRR including the number and mass of each layer of magnetic refrigerants, adiabatic temperature changes, magnetic field change, heat capacity of the refrigerants, the cycle frequency, and temperature profile from $T_{HOT}$ to $T_{COLD}$ within each layer of the multi-layered regenerator that determines the fraction of the active magnetic regenerator that cools below the average $T_{COLD}$ each cycle. With an optimum hot-to-cold flow rate of helium heat transfer gas through the active magnetic regenerators the average cooling power of each layer of the demagnetized regenerator (using Gd and several Gd-RE alloys as examples of an excellent magnetic refrigerants from ~280 K to ~120 K) is given by the following equation for Gd as: $\dot{Q}_{Gd}(T_{COLD}) = vFr_{COLD}M_{Gd}C_{Gd}(T_{COLD},B_{0.6T})\Delta T_{CD}(T_{COLD})$ where $\dot{Q}_{Gd}(T_{COLD})$ is the cooling power in W, v is the AMR cycle frequency in Hz, $Fr_{COLD}$ is a blow-averaged dimensionless fraction of the regenerator that is colder than the average $T_{COLD}$ of the demagnetized regenerator before the hot-to-cold blow of the helium heat transfer gas, $M_{Gd}$ is the mass of Gd in a flow sector of the rotary wheel regenerator in kg, $C_{Gd}$ is the total heat capacity of Gd at $T_{COLD}$ and the low magnetic field after demagnetization in J/kg K, $\Delta T_{CD}$ is the adiabatic temperature change upon demagnetization from high field to low field in K. All the variables in this equation are known except $Fr_{COLD}$. This parameter depends on the axial temperature profile of each layer of a multi-layer AMR that depends upon the cold thermal load for each layer, the heat transfer gas flow rate for each layer, and the percentage of bypass flow for each layer; a typical value is ~0.3. This equation applies to each of the magnetic refrigerants in a layered regenerator. Numerical simulation of axial temperature profiles for active magnetic regenerators comprised of one or multiple layers of refrigerants as a function of total helium heat transfer gas flow and percentage of bypass flow of heat transfer gas can be predicted by solving the partial differential equations that describe AMR performance. A linear axial or radial temperature profile in each layer of magnetic refrigerant in the subject invention is a good approximation for optimum helium heat transfer gas and percentage bypass flow and prediction of $Fr_{COLD}$. Experiments confirm the numerical predictions that 3-12% bypass is the typical range for each layer depending upon the magnetic refrigerant and magnetic field changes. The helium heat transfer gas flow rate for each layer is given by dividing the cooling power of the regenerator by the heat capacity of helium at constant pressure times $\Delta T_{CD}/2$ in kg/s. In the multilayer regenerator described herein the heat transfer gas flow rate is largest in the outermost hotter layer, and smallest in the innermost colder layer and to achieve the optimal heat transfer gas flow rate of each layer, the flow of heat transfer gas is adjusted by diverting a portion of the heat transfer gas flow for sequential layers in the demagnetized layered regenerators to the corresponding magnetized layered regenerators to provide a reduced flow for the next colder layer in the multi-layer regenerator in the hot to cold flow region and an increased flow in the next warmer layer in the multi-layer regenerator in the cold to hot flow region. This is illustrated in FIG. 2.

Certain embodiments of the novel processes and systems have bypass flow of a few percent of cold helium gas (e.g., 3 to 12% of the total heat transfer gas in the hot-to-cold flow through the demagnetized regenerator, more particularly 6%) to continuously pre-cool the hydrogen or other process gas stream thus reducing the number of AMRR stages in an efficient $H_2$ liquefier from 6-8 stages without bypass flow to 2-3 stages with bypass flow. It is obvious fewer AMRR stages using bypass flow to continuously pre-cool the hydrogen process stream will also require substantially less magnetic refrigerant for an equivalent liquefaction rate. Continuous cooling of the hydrogen process stream in a liquefier essentially eliminates a very large source of irreversible entropy generation caused by larger approach temperatures in the process stream heat exchangers and thereby increases the FOM of the liquefier significantly. From this description it is apparent that the flow rate of bypass heat transfer gas is determined by complete removal of the sensible and latent heats from the process stream which in turn determines the total helium heat transfer flow rate for the AMRR stage given the percentage of bypass flow allowed by the thermal mass differences in the magnetic regenerator which in turn determines the mass of the magnetic regenerator given the $\Delta T_{COLD}$ from the magnetocaloric effect. This novel design process minimizes the number of AMRR stages and mass of magnetic refrigerants in liquefiers for hydrogen and other gases. For example, in certain embodiments the process and system has only two stages; a first stage for cooling the process gas from 280 K to 120 K and a second stage for cooling the process gas from 120 K to 20 K or 4 K.

The magnetic refrigerants in the AMR beds have a difference in thermal mass which is the product of heat capacity per unit mass times the mass of magnetic refrigerant (or just heat capacity in this case because the mass of magnetic material in a magnetic regenerator doesn't depend upon temperature or magnetic field). The heat capacity of a ferromagnetic material below the Curie temperature (ordering temperature) is smaller in higher magnetic fields than at lower or zero magnetic fields. However, this difference switches at the Curie temperature because the heat capacity in higher magnetic fields decreases slowly as the temperature increases while the heat capacity in low or zero fields drops sharply at the Curie temperature such that the heat capacity at higher fields becomes larger than the heat capacity in lower or zero magnetic fields. This means the difference in thermal mass between a magnetized AMR bed and a demagnetized AMR bed changes sign at the Curie temperature and the net difference in thermal mass for an AMR cycle spanning across the Curie temperature rapidly decreases with increasing temperature. Therefore, the optimal amount of bypass flow for an AMR cycle that extends above the Curie temperature will rapidly decrease to zero. Simultaneously an AMR cycle operated this way will become less efficient due to increased intrinsic entropy generation in such an AMR cycle and due to insufficient bypass flow to pre-cool the same amount of hydrogen process gas. In the design of the novel processes and systems disclosed the importance of selecting and controlling the hot sink temperature and temperature span to maximize the difference in thermal mass (and thereby the amounts of bypass flow) is recognized. First, the dynamic $T_{HOT}$ is always $\Delta T_{HOT}$ less than the Curie temperature of the magnetic refrigerant at the hot end of the regenerator (i.e., the outer-most refrigerant in the layered rim of the wheel in FIG. 1) at its maximum during the magnetization step of the AMR cycle. $T_{HOT}$ is the environmental temperature where the heat is dumped. The dynamic $T_{HOT}$ is the increase in temperature caused by inserting the regenerator into the magnetic field. The maximum dynamic $T_{HOT}$ depends on where it is in the cycle, but generally the maximum is $T_{HOT}+\Delta T_{HOT}$. This can be done by setting a fixed heat sink temperature to anchor $T_H$ which in turn yields the largest difference in thermal mass between high and low magnetic fields. The second aspect of the difference in thermal mass in high and low magnetic fields is that it decreases steadily as the cold temperatures in the regenerator decrease below the Curie temperature (s) of the magnetic refrigerants. Hence, the magnetic materials in an AMR bed must operate in temperature spans when magnetized of $T_H+\Delta T_{HOT}<T_{Curie}$ and $T_C+\Delta T_{COLD}$ equal to ~20 K<$T_{Curie}$ and when demagnetized, between $T_H-\Delta T_{HOT}$ and $T_C-\Delta T_{COLD}$ which are ~20 K apart. $T_C$ represents cold temperatures of a slice of magnetic regenerator at any point in the AMR as it executes its tiny magnetic Brayton cycle. $\Delta T_{COLD}$ represents the temperature drop caused by the magnetocaloric effect when the regenerator is removed from the magnetic field. If larger temperature spans with optimum differences in thermal mass are desired (as required for very high FOM), layers of magnetic materials with descending Curie temperatures must be used in the AMR bed.

Figure 5:
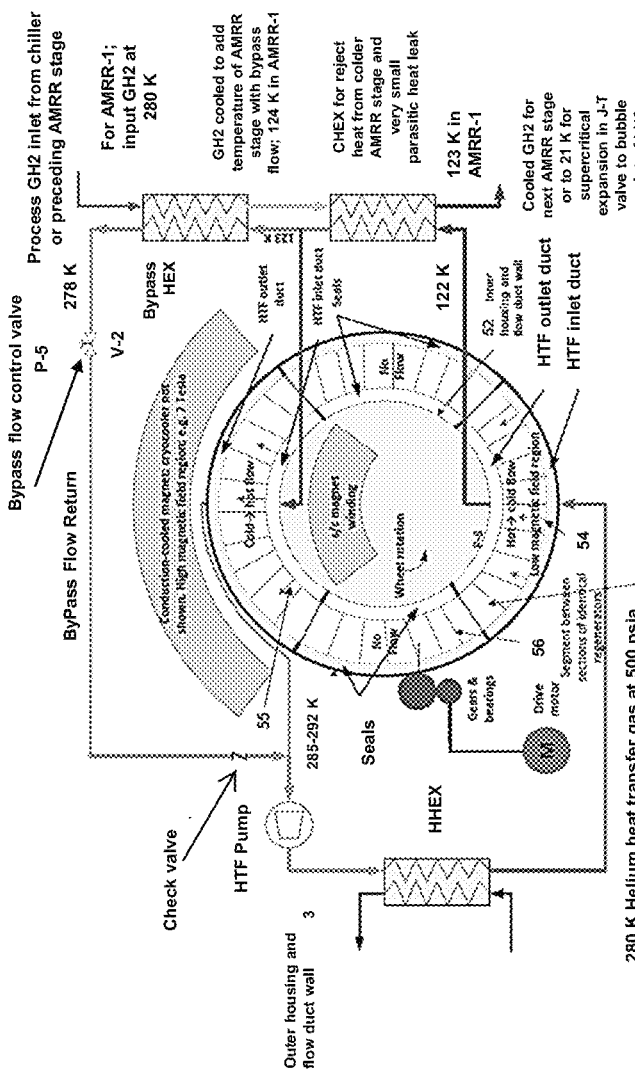
FIG. 5 is a schematic diagram of a cross-section of a rotary wheel embodiment of a single-stage active magnetic regenerative refrigerator (AMRR) with bypass flow. For example, the embodiment shown in FIG. 5 is a schematic diagram of a single stage AMRR with layered magnetic materials and bypass flow of heat transfer fluid to continuously cool a process stream such as gaseous $H_2$ (GH2) or natural gas. In this stage there are eight magnetic materials to span from ~280 K to ~122 K. This design also works for 122 K to 53 K or from 53 K to 22 K; each with fewer layers of refrigerants and less material as required for a $LH_2$ liquefier.

An illustrative embodiment of an AMRR apparatus is shown in FIG. 1. The AMRR apparatus includes an 8-magnetic refrigerant material layer dual AMR regenerator arrangement—first AMR multilayer regenerator 1 and second AMR multilayer regenerator 2. This AMRR apparatus is suitable for use in a reciprocating regenerator configuration with a stationary magnet. A similar arrangement exists in a rotary wheel as shown in FIG. 5, described below in more detail, where the section of the layered wheel rim in the high field region of the wheel is a first AMR regenerator segments and the section of the same wheel rim in the low field region of the wheel is a set of second AMR regenerator segments. The individual layers in the first AMR regenerator 1 are labeled 1*t*, 2*t*, 3*t*, 4*t*, 5*t*, 6*t*, 7*t* and 8*t*. The corresponding individual layers in the second AMR regenerator 2 are labeled 1*b*, 2*b*, 3*b*, 4*b*, 5*b*, 6*b*, 7*b* and 8*b*. A first diversion fluid conduit 3 fluidly couples a heat transfer fluid outlet of layer 1*t* with a heat transfer fluid inlet layer 1*b*. Similarly, a second diversion fluid conduit 4 fluidly couples a heat transfer fluid outlet of layer 2*t* with a heat transfer fluid inlet layer 2*b*, a third diversion fluid conduit 5 fluidly couples a heat transfer fluid outlet of layer 3*t* with a heat transfer fluid inlet layer 3*b*, a fourth diversion fluid conduit 6 fluidly couples a heat transfer fluid outlet of layer 4*t* with a heat transfer fluid inlet layer 4*b*, a fifth diversion fluid conduit 7 fluidly couples a heat transfer fluid outlet of layer 5*t* with a heat transfer fluid inlet layer 5*b*, a sixth diversion fluid conduit 8 fluidly couples a heat transfer fluid outlet of layer 6*t* with a heat transfer fluid inlet layer 6*b*, and a seventh diversion fluid conduit 9 fluidly couples a heat transfer fluid outlet of layer 7*t* with a heat transfer fluid inlet layer 7*b*. The amount of heat transfer fluid diverted through the diversion fluid conduits may vary, but in certain embodiments, the volume percentage of total flow for diverted fluid per each layer increases from 18% to 59%, or 15% to 60%, from layer 1 to layer 7 with zero diverted flow in the $8^{th}$ layer of the heat transfer fluid flow volume flowing into the inlet of the respective layer. In certain embodiments, the individual diversion flows are diverted at a location between adjacent layers in the demagnetized region and re-injected at a location between corresponding adjacent layers in the magnetized region. The diverted flows for a reciprocating dual regenerator configuration are illustrated in FIG. 1.

In a rotary wheel configuration the dual regenerators are on opposite sections of the wheel and the diverted flow channels, although not shown in FIG. 5, are placed circumferentially around the wheel rim such that diverted flow from thin spacers between the layers of the demagnetized set of regenerator segments with hot-to-cold heat transfer gas flow to the same thin spacers in the corresponding layers of the magnetized set of regenerators with cold to hot heat transfer gas flow. The amount of diverted flow is controlled by controlled diversion flow valves for each diversion flow channel for each corresponding layer. A controllable diversion flow valve may be present between adjacent magnetized layers that reduces the flow of heat transfer fluid into the next smaller layer and transfers the diverted flow into the corresponding layers in the magnetized dual regenerator. During cool down of the dual regenerators from an initial temperature of ~280 K in all layers, independent control of each diversion-flow valve allows the sequential cool down of the layers as they are cooled several degrees below their respective Curie temperatures. After all layers are in their respective operating temperature ranges, the diversion flows can be tuned to optimize cooling performance of the dual regenerator. A multilayer AMRR can be cooled down by controlling the diversion flow valves to initially flow only through a top most layer that is below its Curie temperature at 280 K until the next adjacent layers are cooled to below their respective Curie temperatures to enable normal steady-state operation.

Figure 3:
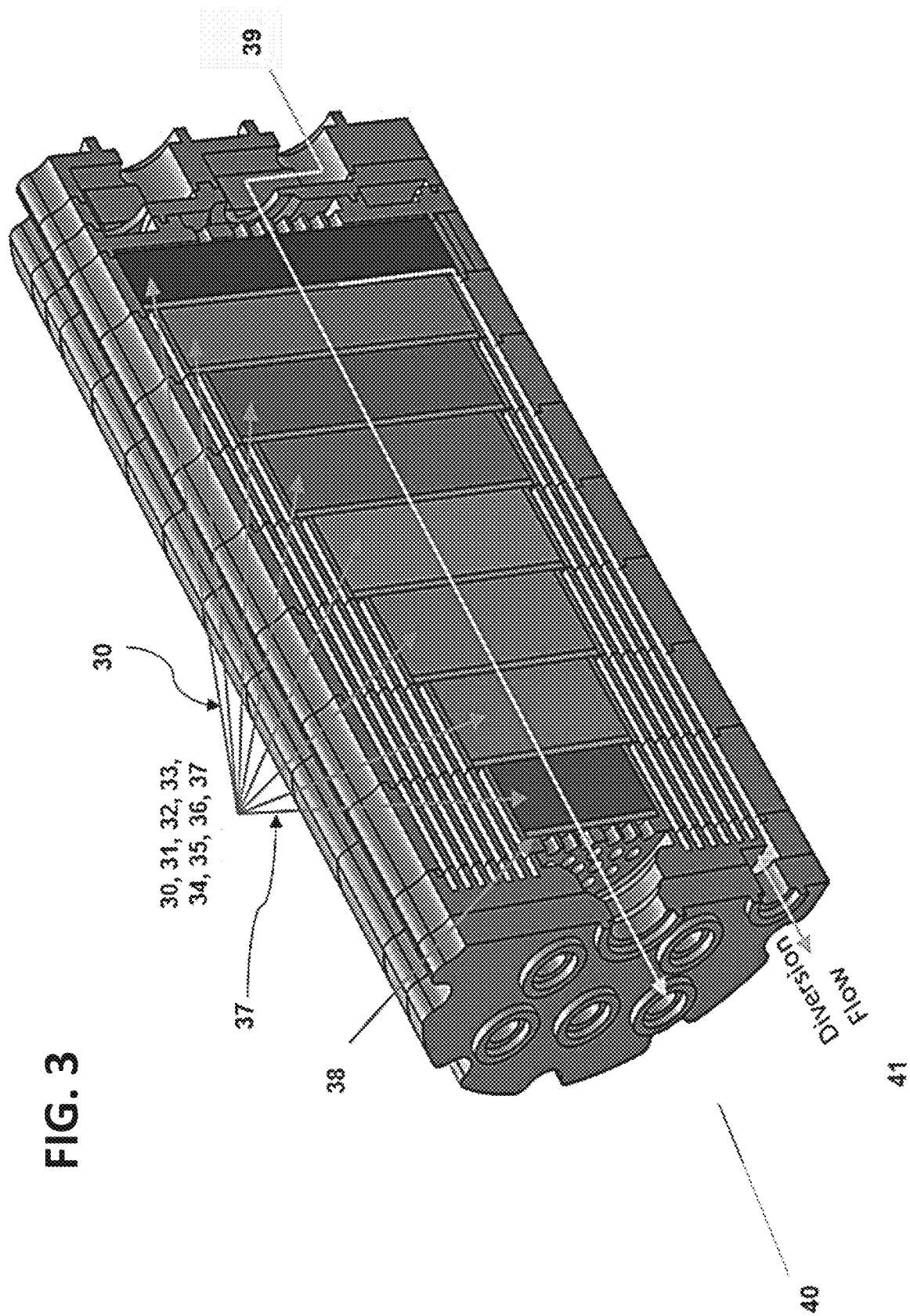
FIG. 3 is a cross sectional perspective view of an AMRR regenerator.

During operation of the AMRR apparatus each layer of magnetic refrigerant in a multilayer regenerator has a different heat transfer gas flow rate relative to each adjacent layer. The difference in heat transfer gas flow rate between one layer and the next adjacent layer may range proportionally to provide optimum heat transfer fluid flow rates in each sequentially smaller layer as shown in FIG. 3. For example, the difference in heat transfer gas flow rate between one layer and the next adjacent layer may range from 27 percent between the first and second layers to 1.5 percent between the seventh and eight layers.

A non-diverted or main stream 16 of the heat transfer fluid flows from each layer to the adjacent layer. Each separate gas stream 16 between adjacent layers is about 20 K different in temperature as expected except the coldest layer(s) that provides the single bypass stream to continuously cool the process stream and then supplies the remaining portion or unbalanced portion as a cold to hot flow 17 for the magnetized layer(s), starting with the coldest layer 8*b*. The bypass flow portion constitutes 1 to 15, more particularly 4 to 6, weight percent of the total amount of heat transfer fluid exiting the coldest layer of low magnetic or demagnetized field section.

An outlet of the coldest Curie temperature refrigerant layer (layer 8*t*) is fluidly coupled to a bypass flow conduit 10 (in the embodiment shown in FIG. 1 there is only a single bypass flow conduit). The bypass heat transfer fluid flow is sent to a bypass heat exchanger 11 from the cold heat transfer fluid flowing out of the cold duct in the low field or demagnetized region to maintain steady-state flow and thus the very small 1 to 5 K, more particularly 0.5-2 K, approach temperatures between bypass flow and counterflowing process gas at all times and locations in the bypass heat exchanger 11. In the rotary wheel configuration the bypass heat transfer fluid flow is continuously sent to the bypass heat exchanger. In the reciprocating dual regenerator configuration, a continuous bypass flow may be accomplished with two identical dual regenerator systems out of phase with each other by 90 degrees so one regenerator of the four in this embodiment provides cooling with several three-way valves to provide continuous bypass flow into the process heat exchanger during the appropriate hot to cold flow periods of the AMR cycle in the reciprocating configuration.

The bypass heat transfer fluid is introduced into the bypass heat exchanger 11. The bypass heat transfer fluid cools the process gas that is also introduced into the bypass exchanger 11. The process gas is delivered to the bypass heat exchanger 11 via a process gas conduit 12 that is fluidly coupled to a process gas source. If the process gas is hydrogen, the source may be an electrolyzer, an autoreformer, steam-methane reformer or another source. In certain embodiments, for hydrogen liquefaction, the process gas channels of the bypass heat exchanger include at least one ortho $H_2$ to para $H_2$ catalyst. The exothermal catalysis heat and sensible heat in the hydrogen gas stream are removed only via the bypass flow in the process heat exchanger.

In certain embodiments, the exhaust heat of the AMRL from the $1^{st}$ layer of the dual layer configuration in FIG. 1 is rejected into a hot heat sink exchanger by the heat transfer gas in the cold to hot flow. The hot heat sink exchanger is cooled by a fluid flow such as water-glycol mixture from the controllable hot heat sinker chiller. This chiller also cools the process stream gas to ~280 K before it enters the process stream heat exchanger.

The bypass heat transfer fluid exiting the bypass heat exchanger is combined with a hot heat transfer fluid flow exiting the high magnetic field section (i.e., layer 1b). In certain embodiments, the bypass heat transfer fluid exiting the bypass heat exchanger is combined with the hot heat transfer fluid flow at the suction side of a pump that circulates the heat transfer gas. The combined bypass heat exchanger exit fluid flow and hot heat transfer flow is introduced into the highest Curie temperature layer (i.e. layer 1t) via introduction conduit 13. The hot heat transfer flow is fluidly coupled to the bypass heat exchanger exit fluid flow via conduit 15. In certain embodiments, the mixed bypass heat exchanger exit fluid flow and hot heat transfer flow may pass through an optional chiller hot heat sink exchanger 14. The exhaust heat from a thermodynamic cycle such as the AMRR must be removed to complete the cycle and the temperature-controlled chiller is the means to do this. It also allows setting of the steady-state $T_{HOT}$ of the AMRR at ~280 K.

FIG. 1 shows a dual regenerator AMRR that includes a first regenerator 1 and a second regenerator 2. The reciprocating embodiment shown in FIG. 1 depicts the upper or top regenerator 1 in a demagnetized state and the lower or bottom regenerator 2 in a magnetized state. Of course, since the apparatus reciprocates in and out of a magnetic field, the demagnetized/magnetized state of the respective regenerators 1 and 2 will continuously reverse from each other.

In the rotary wheel configuration the wheel rotation continually causes layered regenerator segments in the rim of the wheel to be entering the high field region simultaneously as other identical layered regenerator segments are entering the low field region of the wheel. An illustrative rotary wheel embodiment is shown in FIG. 5.

The rotary AMRR apparatus of FIG. 5 includes an annular bed 51 of at least one porous magnetic refrigerant material. As shown in FIG. 5, the rotary AMRR apparatus is divided into four sections (listed in order of wheel rotation): (i) a high magnetic field section in which the heat transfer gas flows from a cold side to a hot side through the magnetized bed(s), (ii) a first no heat transfer gas flow section in which the bed(s) are demagnetized, (iii) a low magnetic or demagnetized field section in which the heat transfer gas flows from a hot side to a cold side through the demagnetized bed(s), and (iv) a second no heat transfer gas flow section in which the bed(s) are magnetized. Circumferential seals are provided in the no circumferential heat transfer gas flow sections to prevent the heat transfer gas flow. Radial seals are provided in the radial heat transfer gas flow sections to prevent the heat transfer gas flow over or under regenerators so only radial flow occurs. The multilayer magnetic regenerators may be divided into compartments 56 wherein the compartments eliminates circumferential flow of heat transfer gas through the porous regenerators while allowing radial flow of heat transfer gas.

The rotary AMRR apparatus includes a rotating wheel that includes an inside hollow annular rim 52 (inner housing and flow duct wall) and an outside hollow annular rim 53 (outer housing and flow duct wall). A hot heat transfer fluid (HTF) (e.g., helium gas) is introduced into the outside rim 53 of the rotary AMRR apparatus via an HTF inlet duct provided in the low magnetic or demagnetized field section (iii). The hot HTF in the outside rim 53 has a steady-state circumferentially average temperature that, for example, may be 280-285 K. However, the local temperature at a given time and location in the AMR cycle may differ from the steady-state circumferentially average temperature. The hot HTF flows in a radial direction through the low magnetic or demagnetized bed, cooling the HTF. The cooled heat transfer fluid exits the low magnetic or demagnetized field section (iii) via an HTF outlet duct and into the inside rim 52. The HTF radial flow is shown by the arrows 54 in the low magnetic or demagnetized field section (iii). The cold HTF in the inside rim 52 has a steady-state circumferentially average temperature that, for example, may be 125-130 K or 118-123 K. However, the local temperature at a given time and location in the AMR cycle may differ from the steady-state circumferentially average temperature. The inside rim 52 is fluidly coupled via an HTF outlet duct and a conduit to an inlet of an optional cold heat exchanger (CHEX). If desired, the CHEX is for the reject heat from a colder AMRR stage and for very small parasitic heat leaks. As can be seen the approach temperature differential in the CHEX is 1 K.

The heat transfer fluid exits the CHEX and into a T-junction in which a portion of the heat transfer fluid bypasses the high magnetic field section (i) and instead is directed to an inlet of a bypass gas heat exchanger. The flow at the T-junction may be controlled a bypass flow control valve. In certain embodiments, 3-12%, particularly less than 12%, more particularly less than 8%, and most particularly 6%, of the heat transfer fluid is diverted to the bypass gas heat exchanger. The remaining heat transfer fluid is introduced as the cold flow into the inside rim 52 at the high magnetic field section (i) via an HTF inlet duct.

The cold HTF flows in a radial direction through the high magnetized bed, heating the HTF. The hot HTF exits the high magnetic field section (i) via an HTF outlet duct and into the outside rim 53. The HTF radial flow is shown by the arrows 55 in the high magnetic field section (i). The hot HTF exits the high magnetic field section (i) and is introduced via a conduit to into a hot heat exchanger (HHEX). The HHEX cools the heat transfer fluid down to a suitable temperature for introduction as the hot flow into the low magnetic or demagnetized field section (iii).

As mentioned above, the bypass HTF is introduced into a bypass HEX. The bypass HTF cools the process gas that is also introduced into the bypass HEX. In certain embodiments, the bypass HEX includes at least one ortho $H_2$ to para $H_2$ catalyst. The heat from the exothermic catalysis and sensible heat in the cooling process gas stream are removed only via the bypass HEX. In other words, no other heat exchangers are required to remove the catalytic and sensible heat (as mentioned above, the CHEX only removes the reject heat from a colder AMRR stage and very small parasitic heat leaks). As can be seen the approach temperature differential in the bypass HEX is 1K.

The bypass HTF exiting the bypass HEX is mixed with the hot HTF flow exiting the high magnetic field section (i). The mixed bypass HEX and hot HTT flow is introduced into the HHEX.

For optimal heat transfer, different mass flow rates of heat transfer gas are required in these two stages (i.e., magnetized vs. demagnetized), and this is accomplished by bypass of some cold heat transfer gas from the hot-to-cold flow step before the cold-to-hot flow step of the cycle. For example, maximum use of continuous flow of cold sensible heat in the bypass stream as it returns to higher temperatures in a counterflow heat exchanger to continuously cool a process gas stream can increase the FOM of an active magnetic regenerative liquefier (AMRL) from ~0.35 in conventional gas-cycle liquefiers to ~0.60 or more in AMRLs. Besides increasing the FOM, the use of bypass stream to continuously and completely cool the process gas significantly reduces the refrigeration cooling capacity per AMRR stage and thereby reduces the mass of magnetic refrigerants required in the AMRL. Rotary AMRLs intrinsically have continuous bypass gas flow for continuous pre-cooling of a process gas stream while reciprocating AMRLs need at least two sets of dual regenerators with proper phasing in/out of the magnetic field with three-way valves to provide continuous bypass gas flow into the process heat exchangers.

In certain embodiments, the diameter of an assembled dual regenerator subsystem has to fit inside the high-field volume inside of a superconducting magnet such that either one of the dual regenerators is sequentially in the high-field region such as 6-7 T. The separation between the centers of the dual layered regenerators should be sufficient to ensure a driver such as a linear actuator will be able to axially move enough to ensure either regenerator is in the low field such as ~0.3 T in the demagnetized step during the AMR cycle. In FIG. 1 this axial distance is the distance from the spacer between the $4^{th}$-$5^{th}$ layers of the upper regenerator to the corresponding $4^{th}$-$5^{th}$ layers of the bottom regenerator. In the rotary wheel configuration this distance is determined by selecting the wheel diameter and the design of the superconducting magnet such that the high field region of the wheel is in 6-7 T and the low-field region of the wheel is in ~0.3 T. The heat transfer fluid mass flow is directly proportional to the process gas flow rate, the percent bypass flow, and the amount of magnetic refrigerant per layer, so to fully utilize each layer of magnetic refrigerant, it is important to adjust the heat transfer gas mass flow between each layer.

For example, given a $GH_2$ mass flow rate of $2.89 \times 10^{-5}$ kg/s or equivalent provides ~10 gallons/day of $LH_2$/day. The total sensible heat thermal load including ortho-para conversion to cool this flow rate of equilibrium/normal $GH_2$ from 280 K to equilibrium $GH_2$ at 120 K is 62.4 W. Assuming the cold helium bypass flow at 200 psia enters the process heat exchanger at 118 K and warms to 278 K while providing continuous cooling of the $GH_2$, the mass of bypass helium is $7.50 \times 10^{-5}$ kg/s.

The hot-to-cold helium mass flow enters the demagnetized $8^{th}$ layer at 140 K and exits this layer at 118 K and with 6% bypass, the resultant hot-to-cold helium mass flow rate in the demagnetized $8^{th}$ layer is $0.72 \times 10^{-3}$ kg/s up to $1.25 \times 10^{-3}$ kg/s. The difference in helium mass flow into layer $1t$ and into layer $8t$ of the demagnetized regenerator can be accomplished by diverting a controlled amount of helium flow (after layer $1t$ and before layer $2t$) in the demagnetized regenerator and re-introducing the diverted flow at the corresponding location (between layer $2b$ and layer $1b$) in the magnetized regenerator and similarly for the other layers in the dual regenerators.

The results of our design calculations for an illustrative flow through an 8-layer dual regenerators are summarized in Table 1 below.

| Layer | Material | Average $T_{HOT}/T_{COLD}$ (K) | Curie Temp (K) | Mass of magnetic material/layer (grams) | Work rate/layer (W) | $Q_{HOT}$/layer (W) |
|---|---|---|---|---|---|---|
| 1 | Gd | 280/260 | 293 | 268 | 11.0 | 132 |
| 2 | $Gd_{0.9}Y_{0.1}$ | 260/240 | 274 | 258 | 9.9 | 110 |
| 3 | $Gd_{0.3}Tb_{0.7}$ | 240/220 | 253 | 235 | 8.8 | 90.7 |
| 4 | $Gd_{0.69}Er_{0.31}$ | 220/200 | 232 | 202 | 7.6 | 71.9 |
| 5 | $Gd_{0.32}Dy_{0.68}$ | 200/180 | 213 | 172 | 6.3 | 54.4 |
| 6 | $Gd_{0.15}Dy_{0.85}$ | 180/160 | 193 | 139 | 4.9 | 38.4 |
| 7 | $Gd_{0.27}Ho_{0.73}$ | 160/140 | 173 | 100 | 3.4 | 23.9 |
| 8 | $Gd_{0.16}Ho_{0.84}$ | 140/120 | 153 | 57 | 1.8 | 11.0 |

The ideal refrigeration power required to cool this flow rate of 300 psia $GH_2$ stream from 280 K to 120 K is 28.7 W. With the existing 8-layer dual regenerators and the work rates and modest regenerator efficiencies for each layer, the initial calculated relative efficiency is 53.5%.

A number of factors can be taken into account for designing an AMRR system. The regenerators needed to fit within a magnet bore, the spacing between the regenerators may be limited by the actuator stroke length, and in order to limit the amount of parasitic heat leak it was desirable to have the exterior of the regenerators in vacuum. The high-field superconducting magnets are also in vacuum and separately conductively cooled to ~4 K by a cryocooler (not shown).

An illustrative design includes two regenerators separated by a center section where the bypass is pulled from, and all three of these sections are held together with a compressive bolt load. For example, FIG. 2 shows a cross-section of a first regenerator 20 and a second regenerator 21. A center section 22 is disposed between the first regenerator 20 and the second regenerator 21. An external vacuum tube 23 encompasses the regenerators 20 and 21 and the center section 22 enabling establishing a vacuum around the exterior of the regenerators to reduce parasitic heat leaks.

FIG. 3 shows a cross-section of one of the dual regenerators. The magnetic refrigerant layers are colored sections in FIG. 3 and represent each of the eight layers 30, 31, 32, 33, 34, 35, 36, and 37 in descending order from highest Curie temperature layer 30 to lowest Curie temperature layer 37. The mass of each of the eight layers 30-37 differ from each other in descending order from highest Curie temperature layer 30 to lowest Curie temperature layer 37. In certain embodiments, the mass difference between adjacent layers is 1 to 50, more particularly 4 to 43 percent. The blue colored layer 37 is the coldest layer with the smallest diameter (e.g., 1.25") and the lowest mass. The layers get 0.25" larger in diameter (e.g., 0.25" increase per layer) as they move up and the mass increases up to the red layer 37 that is the warmest with the largest diameter and mass. The diameter, mass and thickness of each layer is listed in Table 2. The layers 30-37 are each separated from each other by a mesh layer 38 (depicted as a green colored layer) that allows a main heat transfer fluid 39 to flow in the direction of a longitudinal axis 40 of the regenerator and allows a portion of the heat transfer fluid to flow out radially to diversion flow channels 41 at each layer. In one embodiment, the combined height of the layers is 4.77 inches, but the regenerator is actually taller due to the mesh layer. The final total height of each regenerator is 5.2" which is near the maximum height a regenerator could be for an 8" tall magnet. The regenerator may be built from a series of machined parts and adhered together. The diversion flow channels 41 are incorporated into each of the machined parts and are formed when the parts are sealed together. This eliminates most of the external plumbing and eases assemble, and also should minimize the heat leak. The warmest diversion flow channel is disposed closest to the outside of the regenerator and each subsequent diversion channel moves inward toward the center of the regenerator. This effectively allows the diversion flow of one layer to provide a cooling ring around the layer below it. The diversion flow is collected into a single tube at the bottom of the regenerator where it flows into the center section and is sealed to the middle section by a compressive Teflon seal. FIG. 2 shows a centrally aligned conduit 42 for the main heat transfer fluid flow, and a peripherally located conduit 43 for the individual diversion flows. The amount of pressure drop and therefore the amount of diversion flow can be changed by changing the amount or size of flow impedance beads in the tubes of the center section. The diversion flow for each layer will have its own tube in the center section where the pressure drop can be adjusted.

Figure 4:
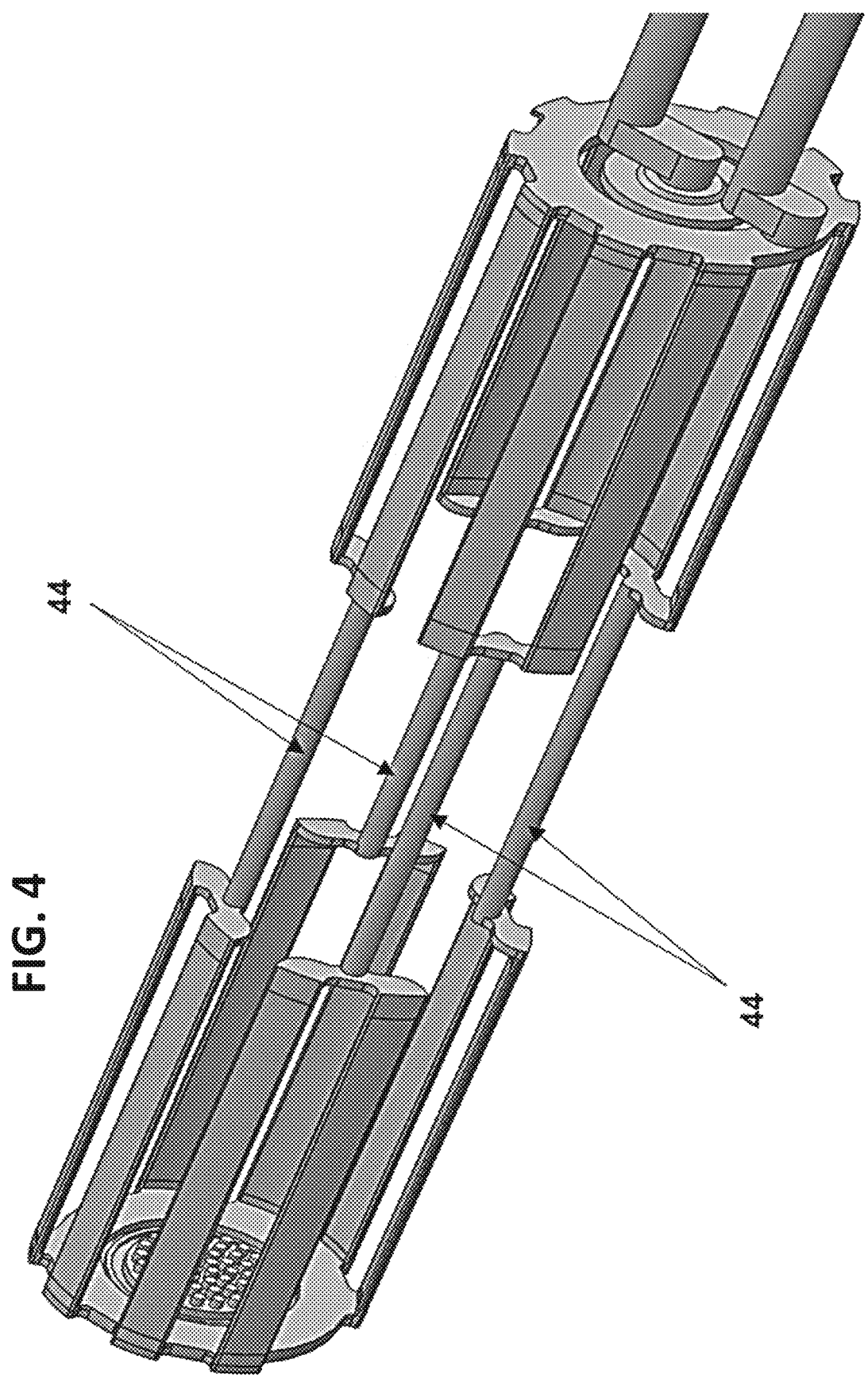
FIG. 4 is a perspective view of an AMRR apparatus.

In FIG. 4 there are four diversion flow channels per each layer except the 8$^{th}$ layer which only has bypass flow and no diversion flow. Four diversion flow channel openings between each layer are machined into the container for the layered regenerator. Four thin-wall stainless steel tubes are epoxy sealed to the openings between each layer to connect to the corresponding opening in the same location in the identical dual regenerator. The diversion flow is adjusted by controlled flow impedance of the tubes.

channels built into the outer edge of each regenerator. These channels then connect to one of four tubes running through the center section. Four tubes are required due to the higher gas flow rate. The four tubes of the center section then connect to the channels on the other regenerator and finally combine back to one flow at the end of the lower regenerator.

FIG. 4 shows a CAD model of the flow channels for the main flow being routed around the regenerators. In the designs shown in FIGS. 2-4, diversion flow channels are provided around the circumference of each layer of magnetic refrigerant.

Good magnetic refrigerants have large magnetic moments to provide maximum entropy change from changes in magnetic field. The accompanying magnetocaloric effect of a good material is confined to a finite temperature range around its magnetic ordering temperature where the magnetic entropy is strongly temperature and field dependent. To take maximum advantage of bypass flow it is important to maximize the difference between the high-field and low-field thermal mass of magnetic refrigerants. The thermomagnetic properties of the refrigerants must simultaneously satisfy numerous other criteria such as: i) satisfying the adiabatic temperature changes as a function of temperature to satisfy the 2nd law of thermodynamics and ii) allowance for inevitable creation of some irreversible entropy even in the best optimized regenerator designs.

Gadolinium is an excellent magnetic refrigerant and has been generally accepted as the reference material against which other refrigerants are compared. It has a simple ferromagnetic ordering temperature of ~293 K and exhibits

TABLE 2

The physical properties and flow rates for each layer in the regenerators.

| Layer | Mass (g) | Thickness (") | Diameter (") | He Flow (L/s) | DP (psia) | Diversion Flow (L/s) | Pressure Drop for Diversion Flow (psia) |
|---|---|---|---|---|---|---|---|
| Layer 8 [coldest stage] | 57 | 0.561 | 1.25 | 0.133 | 0.213 | N/A | N/A |
| Layer 7 | 100 | 0.683 | 1.5 | 0.32 | 0.493 | 0.187 | 0.426 |
| Layer 6 | 139 | 0.698 | 1.75 | 0.55 | 0.697 | 0.23 | 1.412 |
| Layer 5 | 172 | 0.661 | 2 | 0.83 | 0.805 | 0.28 | 2.806 |
| Layer 4 | 202 | 0.614 | 2.25 | 1.16 | 0.86 | 0.33 | 4.416 |
| Layer 3 | 235 | 0.578 | 2.5 | 1.58 | 0.934 | 0.42 | 6.136 |
| Layer 2 | 258 | 0.525 | 2.75 | 2.02 | 0.931 | 0.44 | 8.004 |
| Layer 1 [warmest stage] | 268 | 0.458 | 3 | 2.46 | 0.855 | 0.44 | 9.866 |
| Total | 1431 | 4.777 | | 9.053 | | 5.788 | |

Table 2 shows the flow rate needed for each layer and the anticipated pressure drop for that flow in this particular example. It also shows the diversion flow rate and pressure drop needed in the diversion flow channel to obtain the desired flow. The diversion flow needed for each layer is the difference in the main He flow between the layer and the cooler layer below it. The pressure drop needed for the diversion flow is the sum of all the pressure drops of the layers between where the diversion flow separates from the main flow to where it joins back up with it. So for example, the diversion flow channel for layer 6 has to match the flow impedance of the combined pressure drops of layers 7 and 8 of both regenerators.

In the embodiment shown in FIGS. 2 and 3, the main fluid flow connection to the lower regenerator is routed through an adiabatic temperature change of ~2 K/Tesla over practical magnetic field strengths (up to ~8 T). It also has a large difference in field-dependent thermal mass just below its Curie temperature. Introduction of alloying additions of another lanthanide metal reduces the magnetic-ordering temperature of Gd without much effect on the total magnetic moment per unit volume and the change in magnetization with temperature near a sharp ordering temperature.

Homogeneous alloys of Gd with other rare earth metals (Tb, Er, Dy, Ho) or Y make superior magnetic refrigerants as well. Other potential rare earth elemental refrigerants such as Ho and Er have more complex magnetic ordering phenomenon but when alloyed with Gd these effects tend to be reduced at high magnetic fields. The addition of non-magnetic Y to Gd reduces the adiabatic temperature change of Gd gradually but simultaneously decreases the magnetic ordering temperature so the simple ferromagnetism of Gd is preserved down to about 200 K.

Key features or suitable refrigerant materials include:
Use ferromagnetic materials that operate below their Curie temperature throughout their entire AMR cycle;
Maintain average $T_{HOT}$ at least $\Delta T_{HOT}$ below the Curie temperature of the uppermost layer of magnetic material in a regenerator; this applies to each layer of magnetic material in the regenerator with correspondingly lower cycle temperatures;
Average temperature difference between $T_{HOT}$ and $T_{COLD}$ should be ~20 K per layer of magnetic refrigerant;
Spanning from 280 K to 120 K in one AMRR stage requires 8 refrigerants to be combined into optimally layered regenerators.
Layering must have smooth flows of energy and entropy at transitions between layered refrigerants along the longitudinal axis of the regenerator.

Illustrative magnetic refrigerants include those shown below in Table 3.

| Material | Operating Temperature Span K | Ordering Temperature K |
|---|---|---|
| Gd | 280-260 | 293 |
| $Gd_{0.90}Y_{0.10}$ | 260-240 | 274 |
| $Gd_{0.30}Tb_{0.70}$ | 240-220 | 253 |
| $Gd_{0.69}Er_{0.31}$ | 220-200 | 232 |
| $Gd_{0.02}Tb_{0.98}$ | 220-200 | 233 |
| $Gd_{0.32}Dy_{0.68}$ | 200-180 | 213 |
| $Gd_{0.66}Y_{0.34}$ | 200-180 | 213 |
| $Gd_{0.39}Ho_{0.61}$ | 180-160 | 193 |
| $Gd_{0.59}Y_{0.41}$ | 180-160 | 193 |
| $Gd_{0.15}Dy_{0.85}$ | 180-160 | 193 |
| $Gd_{0.42}Er_{0.58}$ | 160-140 | 173 |
| $Gd_{0.27}Ho_{0.73}$ | 160-140 | 173 |
| $Gd_{0.16}Ho_{0.84}$ | 140-120 | 153 |
| $Gd_{0.34}Er_{0.66}$ | 140-120 | 152 |
| $Gd_{0.23}Er_{0.77}$ | 120-100 | 132 |
| $(Ho_{0.80}Gd_{0.20})Co_2$ | 120-100 | 130 |
| $Ho_{0.90}Gd_{0.10}Co_2$ | 100-80 | 110 |
| $Ho_{0.95}Gd_{0.05}Co_2$ | 80-60 | 90 |
| $Gd_{0.5}Dy_{0.5}Ni_2$ | 60-40 | 70 |
| $Dy_{0.75}Er_{0.25}Al_2$ | 40-20 | 50 |

Another illustrative refrigerant material is $Gd_xEr_{1-x}Al_2$; Curie temperatures range from 168 K if x=1 to 15 K if x=0 for operation between ~150 K and ~20 K.

Illustrative ortho $H_2$ to para $H_2$ catalysts for use in the bypass flow process heat exchangers include, but are not limited to, activated carbon; ferric oxide ($Fe_2O_3$); chromic oxides ($Cr_2O_3$ or $CrO_3$); Ni metal and Ni compounds ($Ni^{2+}$); rare earth metals and oxides such as $Gd_2O_3$, $Nd_2O_3$, and $Ce_2O_3$; Pt; and Ru. Activated carbon and ferric oxide are particularly preferred. The catalysts may be employed in low concentrations on alumina or similar substrates and placed directly into the hydrogen process stream either in or near the process heat exchangers.

In certain embodiments the catalyst may be incorporated into a micro-channel or tube-in-tube $GH_2$ process heat exchangers in counterflow with the cold helium bypass flows from the AMRR stage(s) to maintain 'equilibrium' hydrogen continuously as the hydrogen is cooled. This continuously removes the exothermic heat of conversion at the highest possible temperatures necessary to maintain very high FOM in the overall liquefier. Thus, certain embodiments of the novel processes and systems can provide a FOM of at least 0.6, more particularly at least 0.7, and most particularly at least 0.75.

As mentioned above, the bypass HTF is introduced into a bypass HEX. The bypass HTF cools the process gas that is also introduced into the bypass HEX. In certain embodiments, the bypass HEX includes at least one ortho $H_2$ to para $H_2$ catalyst. The sensible heat in the process gas stream is removed only via the bypass HEX. In other words, no other heat exchangers are required to remove the sensible heat (as mentioned above, the CHEX only removes the reject heat from a colder AMRR stage and very small parasitic heat leaks). As can be seen the approach temperature differential in the bypass HEX is 3 K (e.g., 117K vs. 120K).

1. A process for liquefying a process gas comprising:
introducing a heat transfer fluid into an active magnetic regenerative refrigerator apparatus that comprises (i) a first module comprising 2 to 16 successive layers, wherein each layer comprises an independently compositionally distinct magnetic refrigerant material having an independent Curie temperature and wherein the first layer has the highest Curie temperature and the last layer has the lowest Curie temperature and (ii) a second module comprising 2 to 16 successive layers, wherein each layer comprises an independently compositionally distinct magnetic refrigerant material having an independent Curie temperature and wherein the first layer has the lowest Curie temperature and the last layer has the highest Curie temperature;
flowing the heat transfer fluid through each layer of the first module and each layer of the second module;
diverting a portion of the flowing heat transfer fluid from an outlet of each layer of the first module to an inlet of the corresponding Curie temperature layer of the second module, except for lowest Curie temperature layer;
diverting a bypass portion of the flowing heat transfer fluid from the lowest Curie temperature layer of the first module into a bypass flow heat exchanger at a first cold inlet temperature;
introducing the process gas into the bypass flow heat exchanger at a first hot inlet temperature and discharging the process gas or liquid from the bypass flow heat exchanger at a first cold exit temperature; and simultaneously subjecting all of the layers of the second module to a higher magnetic field while all of the layers of first module are demagnetized or subjected to a lower magnetic field.

2. The process of clause 1, wherein the first module consists of eight layers and the second module consists of eight layers.

3. The process of clause 1 or 2, wherein the process gas comprises hydrogen or methane and the heat transfer fluid comprises helium.

4. The process of any one of clauses 1 to 3, wherein 1.5 to 26 volume percent of heat transfer fluid is diverted from each layer of the first module to each corresponding Curie temperature layer of the second module.

5. The process of any one of clauses 1 to 4, wherein the bypass portion constitutes 1 to 15 weight % of the total heat transfer fluid exiting the lowest Curie temperature layer.

6. The process of any one of clauses 1 to 5, wherein the bypass flow heat exchanger includes at least one ortho $H_2$ to para $H_2$ catalyst.

7. A system comprising:
a first active magnetic regenerative module comprising 2 to 16 successive layers, wherein each layer comprises an independently compositionally distinct magnetic refrigerant material having an independent Curie temperature and wherein the first layer has the highest Curie temperature and the last layer has the lowest Curie temperature;
a second active magnetic regenerative module comprising 2 to 16 successive layers, wherein each layer comprises an independently compositionally distinct magnetic refrigerant material having an independent Curie temperature and wherein the first layer has the lowest Curie temperature and the last layer has the highest Curie temperature;

at least one conduit fluidly coupled between the lowest Curie temperature layer of the first module and the highest Curie temperature layer of the second module;

a single bypass flow heat exchanger (a) fluidly coupled to the lowest Curie temperature layer of the first module and (b) fluidly coupled to a process gas source; and for each layer of the first module and each layer of the second module, an independent fluid conduit between an outlet of each layer of the first module to an inlet of the corresponding Curie temperature layer of the second module, except for lowest Curie temperature layer of first module.

8. The system of clause 7, wherein each module consists of eight layers of independently compositionally distinct magnetic refrigerant material.

9. The system of clause 7 or 8, wherein the layers of the first module and the second module have Curie temperatures 18-22 K apart between successively adjacent layers.

10. The system of any one of clauses 7 to 9, wherein the successive layers in the first module are arranged in descending magnetic refrigerant material mass for each layer from the first layer to the last layer, and the successive layers in the second module are arranged in ascending magnetic refrigerant material mass for each layer from the first layer to the last layer.

11. An apparatus comprising:

an active magnetic regenerative module comprising multiple successive layers, wherein each layer comprises an independently compositionally distinct magnetic refrigerant material having Curie temperatures 18-22 K apart between successively adjacent layers, and the layers are arranged in successive Curie temperature order and magnetic refrigerant material mass order with a first layer having the highest Curie temperature layer and highest magnetic refrigerant material mass and the last layer having the lowest Curie temperature layer and lowest magnetic refrigerant material mass.

12. The apparatus of clause 11, consisting of eight layers of independently compositionally distinct magnetic refrigerant material.

In view of the many possible embodiments to which the principles of the disclosed invention may be applied, it should be recognized that the illustrated embodiments are only preferred examples of the invention and should not be taken as limiting the scope of the invention.

What is claimed is:

1. A process for liquefying a process gas comprising:

introducing a heat transfer fluid into an active magnetic regenerative refrigerator apparatus that comprises a single stage comprising dual regenerators located axially opposite to each other, wherein the apparatus comprise (i) a first top regenerator comprising 2 to 16 successive layers, wherein each layer comprises an independently compositionally distinct magnetic refrigerant material having an independent Curie temperature and wherein the first layer of the top regenerator has the highest Curie temperature and the last layer of the top generator has the lowest Curie temperature and (ii) a second bottom regenerator comprising 2 to 16 successive layers, wherein each layer comprises an independently compositionally distinct magnetic refrigerant material having an independent Curie temperature and wherein the first layer of the bottom regenerator has the lowest Curie temperature and the last layer of the bottom regenerator has the highest Curie temperature;

flowing a main flow of the heat transfer fluid successively through each layer of the first top regenerator and each layer of the second bottom regenerator;

diverting a portion of the main flow of the heat transfer fluid from an outlet of each layer of the first top regenerator to an inlet of the corresponding Curie temperature layer of the second bottom regenerator, except for the lowest Curie temperature layer of the first top regenerator;

diverting a bypass portion of the main flow of the heat transfer fluid from the lowest Curie temperature layer of the first top regenerator into a single bypass flow heat exchanger at a first cold inlet temperature;

introducing the process gas into the bypass flow heat exchanger at a first hot inlet temperature and at a counterflow with the bypass portion flow, and discharging the process gas or liquid from the bypass flow heat exchanger at a first cold exit temperature; and simultaneously subjecting all of the layers of the second bottom regenerator to a higher magnetic field while all of the layers of first top regenerator are demagnetized or subjected to a lower magnetic field.

2. The process of claim 1, wherein the first top regenerator consists of eight layers and the second bottom regenerator consists of eight layers.

3. The process of claim 1, wherein the process gas comprises hydrogen or methane and the heat transfer fluid comprises helium.

4. The process of claim 1, wherein 1.5 to 26 volume percent of the main flow of the heat transfer fluid is diverted from each layer of the first top regenerator to each corresponding Curie temperature layer of the second bottom regenerator.

5. The process of claim 1, wherein the bypass portion constitutes 1 to 15 weight % of the total heat transfer fluid exiting the demagnetized lowest Curie temperature layer.

6. The process of claim 1, wherein the bypass flow heat exchanger includes at least one ortho $H_2$ to para $H_2$ catalyst.

7. The process of claim 1, wherein the process gas is hydrogen gas and wherein the bypass portion of the flowing heat transfer fluid continuously cools the hydrogen gas from 280 K to 120K in the bypass flow heat exchanger.

8. The process of claim 1, wherein the process gas comprises at least 99% hydrogen.

9. The process of claim 1, wherein each layer has a Curie temperature that differs by 18 to 22 K from each adjacent layer.

10. The process of claim 1, wherein the bypass portion of the flowing heat transfer fluid continuously cools the process gas in the bypass flow heat exchanger throughout the liquefication process.

11. The process of claim 1, further comprising repeating the process in at least one additional stage that is fluidly coupled to the first stage.

12. The process of claim 11, wherein the process gas is hydrogen gas and the first stage cools the hydrogen gas from 280 K to 120 K, and a second stage cools the hydrogen gas from 120 K to 20 K.

13. The process of claim 1, wherein volume percent of the main flow of the heat transfer fluid that is diverted from each layer of the first top regenerator to each corresponding Curie temperature layer of the second bottom regenerator successively increases per each layer.

14. The process of claim 4, wherein the process gas comprises at least 99% hydrogen.

15. The process of claim 14, wherein the bypass portion constitutes 1 to 15 weight % of the total heat transfer fluid exiting the demagnetized lowest Curie temperature layer.

16. The process of claim 1, wherein the heat transfer fluid comprise helium.

17. The process of claim 15, wherein the heat transfer fluid comprise helium.

18. The process of claim 15, further comprising repeating the process in at least one additional stage that is fluidly coupled to the first stage.

19. The process of claim 1, wherein each magnetic refrigerant material operates at or below its respective Curie temperature throughout an entire active magnetic regeneration cycle.

20. The process of claim 19, wherein each magnetic refrigerant material is a ferromagnetic material.

* * * * *